(12) United States Patent
Shin et al.

(10) Patent No.: US 10,833,142 B2
(45) Date of Patent: Nov. 10, 2020

(54) ELECTROLUMINESCENCE DISPLAY DEVICE

(71) Applicant: LG DISPLAY CO., LTD., Seoul (KR)

(72) Inventors: SangIl Shin, Goyang-si (KR); DoHyung Kim, Paju-si (KR); SeHwan Na, Paju-si (KR); YoungJu Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 35 days.

(21) Appl. No.: 15/789,836

(22) Filed: Oct. 20, 2017

(65) Prior Publication Data

US 2018/0122881 A1    May 3, 2018

(30) Foreign Application Priority Data

Oct. 31, 2016    (KR) .......................... 10-2016-0143389

(51) Int. Cl.
| | |
|---|---|
| *H01L 27/32* | (2006.01) |
| *H01L 27/12* | (2006.01) |
| *H01L 51/52* | (2006.01) |
| *G09G 3/3233* | (2016.01) |

(52) U.S. Cl.
CPC ........ *H01L 27/3258* (2013.01); *H01L 27/124* (2013.01); *H01L 27/3246* (2013.01); *H01L 27/3262* (2013.01); *H01L 51/5284* (2013.01); *G09G 3/3233* (2013.01); *G09G 2300/043* (2013.01); *G09G 2310/08* (2013.01); *G09G 2330/10* (2013.01); *H01L 27/3276* (2013.01); *H01L 2251/5315* (2013.01)

(58) Field of Classification Search
CPC ............... H01L 27/3258; H01L 27/124; H01L 27/3276; H01L 27/3246
See application file for complete search history.

(56) References Cited

U.S. PATENT DOCUMENTS

| | | | | |
|---|---|---|---|---|
| 5,693,565 | A * | 12/1997 | Camilletti | H01L 22/20 438/17 |
| 8,823,913 | B2 * | 9/2014 | Jin | G02F 1/00 349/149 |
| 8,927,983 | B2 * | 1/2015 | Tang | H01L 27/1259 257/411 |
| 2013/0037807 | A1 * | 2/2013 | Fukaya | H01L 27/1225 257/57 |
| 2014/0117341 | A1 * | 5/2014 | Song | H01L 51/0097 257/40 |
| 2015/0041791 | A1 * | 2/2015 | Lee | H01L 51/5253 257/40 |

* cited by examiner

*Primary Examiner* — Tuan A Hoang
(74) *Attorney, Agent, or Firm* — Seed Intellectual Property Law Group LLP

(57) ABSTRACT

Provided is an electroluminescence display device. The electroluminescence display device includes a display area, a non-display area positioned the outer periphery of the display area, a thin film transistor in the display area, and a power supply line in the non-display area and connected to the thin film transistor. The power supply line includes a first part and a second part separated from each other, and a third part connected to the first part and the second part, and also includes a first layer formed along an edge portion of the power supply line and covering the edge portion of the power supply line.

23 Claims, 9 Drawing Sheets

ELECTROLUMINESCENCE DISPLAY DEVICE

CROSS-REFERENCE TO RELATED APPLICATIONS

This application claims the priority of Korean Patent Application No. 10-2016-0143389 filed on Oct. 31, 2016, in the Korean Intellectual Property Office, the disclosure of which is incorporated herein by reference.

BACKGROUND

Technical Field

The present disclosure relates to an electroluminescence display device and more particularly, to an electroluminescence display device capable of minimizing defects caused by moisture or oxygen permeation into a power supply line area and improving the reliability.

Description of the Related Art

An electroluminescence display device is a self-luminous type display device. The electroluminescence display device uses a light emitting element in which electrons and holes are injected into an emission layer from an electrode (cathode) for injecting electrons and an electrode (anode) for injecting holes, respectively, and the electrons and holes are combined into excitons. When the excitons transit from an excited state to a ground state, lights are emitted from the light emitting element.

The electroluminescence display device can be classified into a top emission type, a bottom emission type, and a dual emission type depending on a direction of light emission, and can also be classified into a passive matrix type and an active matrix type depending on a driving method.

The electroluminescence display device does not require a separate light source unlike a liquid crystal display (LCD) device. Thus, the electroluminescence display device can be manufactured into a lightweight and thin form. Further, the electroluminescence display device is not only advantageous in terms of power consumption since it is driven with a low voltage, but also, the electroluminescence display device has excellent color expression ability, a high response speed, a wide viewing angle, and a high contrast ratio (CR). Therefore, the electroluminescence display device has been researched as a next-generation display device.

BRIEF SUMMARY

An electroluminescence display device is vulnerable to moisture or oxygen. Therefore, if moisture or oxygen permeates into the electroluminescence display device, a metal electrode of the electroluminescence display device may be oxidized or a light emitting layer may degenerate. Thus, various image quality defects such as pixel shrinkage or dark spot and a reduction in lifetime may occur.

The pixel shrinkage refers to darkening from an edge of a pixel caused by oxidation or degeneration of an interface of a metal electrode and an light emitting layer due to moisture or oxygen permeation. If the pixel shrinkage continues for a long time, it may be worsened to the dark spot which refers to darkening of the whole pixel area, which may greatly affect the reliability of the electroluminescence display device.

As for a conventional electroluminescence display device, moisture or oxygen permeation occurs through damage or cracks at an edge of a power supply line or a void formed along the edge of the power supply line under a protective layer during a process of manufacturing the electroluminescence display device in an unreliable environment of high temperature and high humidity. Therefore, image quality defects such as pixel shrinkage or dark spot occur and are demanded to be improved.

In this regard, the inventors of the present disclosure invented an electroluminescence display device capable of minimizing defects caused by moisture or oxygen permeation through an edge of a power supply line.

Accordingly, an object to be achieved by the present disclosure is to provide an electroluminescence display device capable of minimizing defects caused by moisture or oxygen permeation through an edge of a power supply line. In electroluminescence display device, the power supply line includes a power supply line under a protective layer and a connection part formed on another layer and also includes an anti-moisture permeation pattern formed along the edge of the power supply line and covering the edge of the power supply line.

The objects of the present disclosure are not limited to the aforementioned objects, and other objects, which are not mentioned above, will be apparent to a person having ordinary skill in the art from the following description.

In order to achieve the above object, there is provided an electroluminescence display device which minimizes moisture or oxygen permeation along an edge of a power supply line and thus can reduce the possibility of occurrence of image quality defects and improve the reliability.

According to an aspect of the present disclosure, there is provided an electroluminescence display device. The electroluminescence display device includes a display area, a non-display area positioned adjacent to an the outer periphery of the display area, a thin film transistor in the display area, a power supply line in the non-display area and connected to the thin film transistor, and first layer formed along an edge portion of the power supply line and covering the edge portion of the power supply line. The power supply line includes a first part and a second part separated from each other, and a third part connected to the first part and the second part.

According to another aspect of the present disclosure, there is provided an electroluminescence display device. The electroluminescence display device includes a substrate including a display area and a non-display area. The electroluminescence display device includes a power supply line positioned in the non-display area and connected to a thin film transistor positioned in the display area, a protective layer configured to cover at least a part of the power supply line, and an anti-moisture permeation pattern formed along an edge portion of the power supply line and covering the edge portion of the power supply line.

Details of other exemplary embodiments will be included in the detailed description of the disclosure and the accompanying drawings.

According to the present disclosure, in an electroluminescence display device, a power supply line includes at least one connection part formed on a different layer from the power supply line under a protective layer and an anti-moisture permeation pattern is formed along an edge portion of the power supply line and covering the edge portion of the power supply line. Thus, it is possible to block a moisture permeation path generated by voids formed along the edge portion of the power supply line under the protective layer or damage or cracks at the edge portion of the power supply line. Therefore, it is possible to minimize the occurrence of moisture or oxygen permeation into the electroluminescence display device through the edge portion of the power supply line.

Further, according to the present disclosure, the electroluminescence display device can minimize the occurrence of moisture or oxygen permeation through the edge of the power supply line. Thus, it is possible to minimize image quality defects of the electroluminescence display device and also possible to improve the reliability of the electroluminescence display device.

The effects of the present disclosure are not limited to the aforementioned effects, and other effects, which are not mentioned above, will be apparent to a person having ordinary skill in the art from the following description.

The objects to be achieved by the present disclosure, the aspects, and the effects of the present disclosure described above do not specify essential features of the claims, and, thus, the scope of the claims is not limited to the disclosure of the present disclosure.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
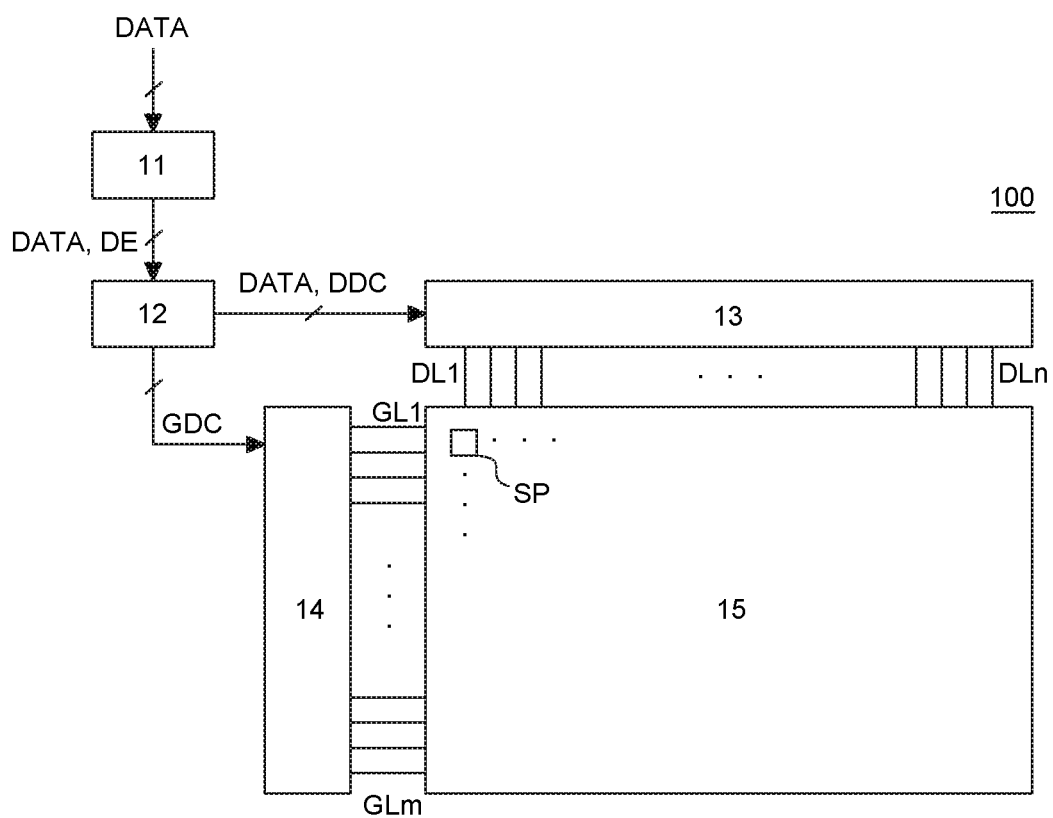
FIG. 1 is a diagram schematically illustrating a structure of an electroluminescence display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly".

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, the present disclosure will be described in detail with reference to the accompanying drawings.

FIG. 1 is a diagram schematically illustrating a structure of an electroluminescence display device according to an exemplary embodiment of the present disclosure.

As illustrated in FIG. 1, an electroluminescence display device 100 according to an exemplary embodiment of the present disclosure includes an image processor 11, a timing controller 12, a data driver 13, a gate driver 14, and a display panel 15.

The image processor 11 outputs a data enable signal DE together with a data signal DATA supplied from the outside. The image processor 11 may output one or more of a vertical synchronization signal, a horizontal synchronization signal, and a clock signal in addition to the data enable signal DE. The image processor 11 is formed as an integrated circuit (IC) in a system circuit board.

The timing controller 12 is supplied with the data signal DATA as well as the data enable signal DE or a driving signal including one or more of the vertical synchronization signal, the horizontal synchronization signal, and the clock signal from the image processor 11.

The timing controller 12 outputs a gate timing control signal GDC for controlling an operation timing of the gate driver 14 and a data timing control signal DDC for controlling an operation timing of the data driver 13 in response to the driving signal. The timing controller 12 is formed as an IC in a control circuit board.

The data driver 13 samples and latches the data signal DATA supplied from the timing controller 12 and then converts the data signal DATA into a gamma reference voltage and outputs the gamma reference voltage in response to the data timing control signal DDC supplied from the timing controller 12. The data driver 13 outputs the data signal DATA through a plurality of data lines DL1 to DLn. The data driver 13 is formed as an IC in a data circuit board.

The gate driver 14 outputs a gate signal in response to the gate timing control signal GDC supplied from the timing controller 12. The gate driver 14 outputs the gate signal through a plurality of gate lines GL1 to GLm. The gate driver 14 may be formed as an IC in a gate circuit board or may be formed in the form of GIP (Gate In Panel) on the display panel 15.

The display panel 15 displays an image corresponding to the data signal DATA and the gate signal supplied from the data driver 13 and the gate driver 14. The display panel 15 includes a plurality of sub-pixels SP that display the image.

Depending on a structure of the electroluminescence display device 100, the sub-pixels SP may include a red sub-pixel, a green sub-pixel, and a blue sub-pixel, or a white sub-pixel, a red sub-pixel, a green sub-pixel, and a blue sub-pixel. Further, the sub-pixels SP may have one or more light emission areas different from each other depending on light emission characteristics.

The electroluminescence display device 100 according to an exemplary embodiment of the present disclosure may be applied to various electronic devices including a TV, a mobile PC, a tablet PC, a monitor, a laptop computer, a display device for vehicle, and a lighting device for vehicle, etc. The electroluminescence display device 100 may also be applied to a wearable display device, a foldable display device, and a rollable display device.

Figure 2:
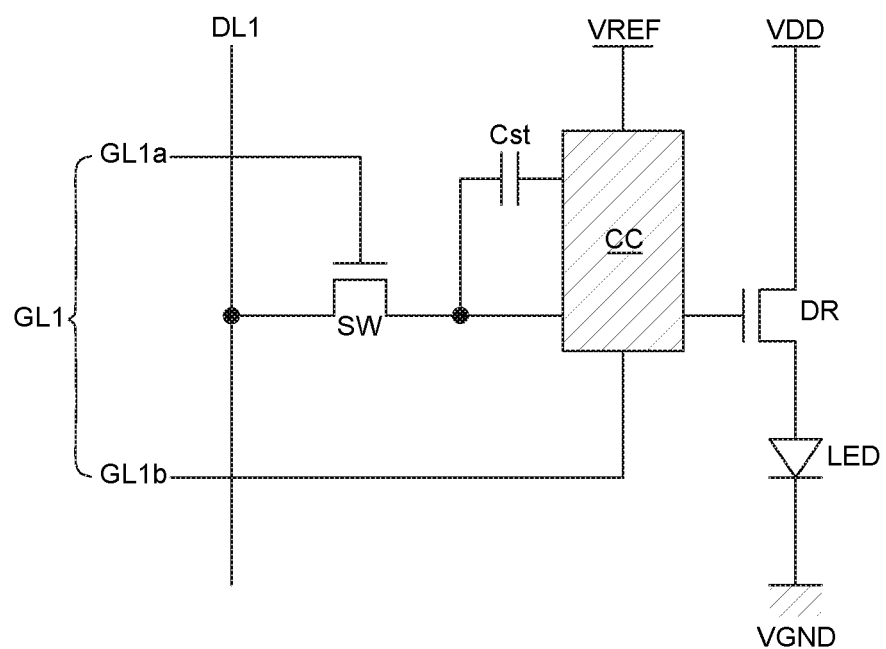
FIG. 2 is a diagram schematically illustrating a circuit configuration of a sub-pixel of an electroluminescence display device according to an exemplary embodiment of the present disclosure.

FIG. 2 is a diagram schematically illustrating a circuit configuration of a sub-pixel of an electroluminescence display device.

Figure 3:
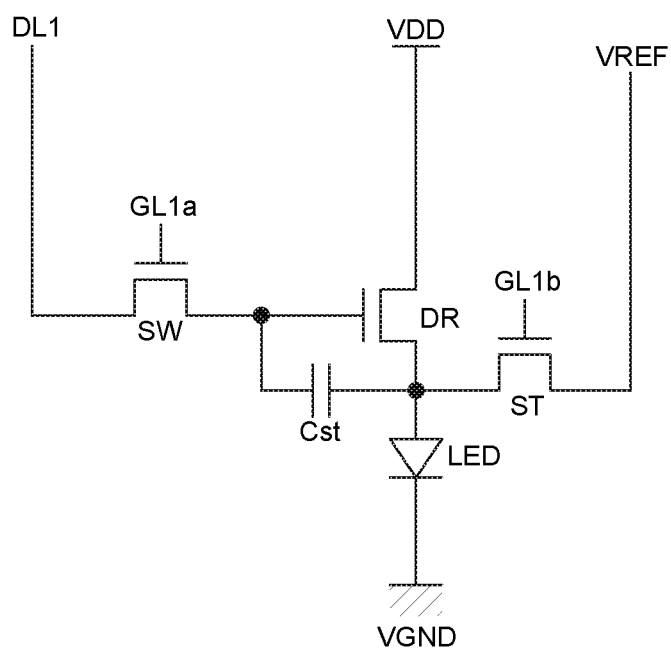
FIG. 3 is an exemplary diagram illustrating a circuit configuration of a sub-pixel in an electroluminescence display device according to an exemplary embodiment of the present disclosure.

Further, FIG. 3 is an exemplary diagram illustrating a circuit configuration of a sub-pixel in an electroluminescence display device according to an exemplary embodiment of the present disclosure.

As illustrated in FIG. 2, a sub-pixel of the electroluminescence display device 100 according to an exemplary embodiment of the present disclosure includes a switching transistor SW, a driving transistor DR, a capacitor Cst, a compensation circuit CC, and a light emitting diode LED. The electroluminescence display device operates to emit a light depending on a driving current generated by the driving transistor DR.

The switching transistor SW performs a switching operation such that a data signal supplied through a first data line DL1 is stored as a data voltage in the capacitor Cst in response to a gate signal supplied through a first 1*a* gate line GL1*a*. The driving transistor DR operates to allow the driving current to flow between a high-voltage power supply line VDD and a low-voltage power supply line VGND depending on the data voltage stored in the capacitor Cst.

The compensation circuit CC is configured to compensate a threshold voltage of the driving transistor DR. The compensation circuit CC includes one or more thin film transistors and/or a capacitor. The compensation circuit CC may have various configurations depending on a compensation method. In the present disclosure, an exemplary compensation circuit will be described with reference to FIG. 3.

As described in FIG. 3, the compensation circuit CC includes a sensing transistor ST and a reference line VREF. The sensing transistor ST is connected between the reference line VREF and an anode electrode (hereinafter, referred to as "sensing node") of the light emitting diode LED. The sensing transistor ST operates to supply an initialization voltage (or sensing voltage) transferred through the reference line VREF to the sensing node or sense a voltage or current of the sensing node.

In the switching transistor SW, a gate electrode is connected to the first 1*a* gate line GL1*a*, a first electrode is connected to the first data line DL1, and a second electrode is connected to a gate electrode of the driving transistor DR.

In the driving transistor DR, the gate electrode is connected to the second electrode of the switching transistor SW, a first electrode is connected to the first power supply line VDD, and a second electrode is connected to the anode electrode of the light emitting diode LED.

In the capacitor Cst, a first electrode is connected to the gate electrode of the driving transistor DR and a second electrode is connected to the anode electrode of the light emitting diode LED.

In the light emitting diode LED, the anode electrode is connected to the second electrode of the driving transistor DR and a cathode electrode is connected to the second power supply line VGND.

In the sensing transistor ST, a gate electrode is connected to a first 1*b* gate line GL1*b*, a first electrode is connected to the reference line VREF, and a second electrode is connected to the second electrode of the driving transistor DR and the anode electrode of the light emitting diode LED, both of which may be referred to as the sensing node.

For example, the sensing transistor ST may be similar or identical to or different from the switching transistor SW in operation time depending on a compensation algorithm (or configuration of a compensation circuit). The reference line VREF may be connected to the data driver. In this case, the data driver may sense a sensing node of a sub-pixel and generate a sensing result in real time for an image non-display period or N-frame period (N is an integer of 1 or more).

Further, a compensation target may be a data signal in digital form or a data signal or gamma reference voltage in analog form depending on a sensing result. Also, a compensation circuit that generates a compensation signal (or compensation voltage) based on the sensing result may be implemented within the data driver or the timing controller or as a separate circuit.

Furthermore, in FIG. 3, a sub-pixel having a 3T (Transistor) 1C (Capacitor) structure including the switching transistor SW, the driving transistor DR, the capacitor Cst, the light emitting diode LED, and the sensing transistor ST is illustrated as an example. However, depending on the structure of the compensation circuit CC, the subpixel may be configured to have a 3T2C, 4T2C, 5T1C, 6T1C, 6T2C, 7T1C, or any other structure.

Moreover, the thin film transistors TFTs such as the switching transistor SW, the driving transistor DR, and the sensing transistor ST may be implemented in various ways based on a semiconductor layer formed of amorphous silicon (a-Si), polycrystalline silicon (poly-Si), oxide semiconductor, or organic material.

Figure 4:
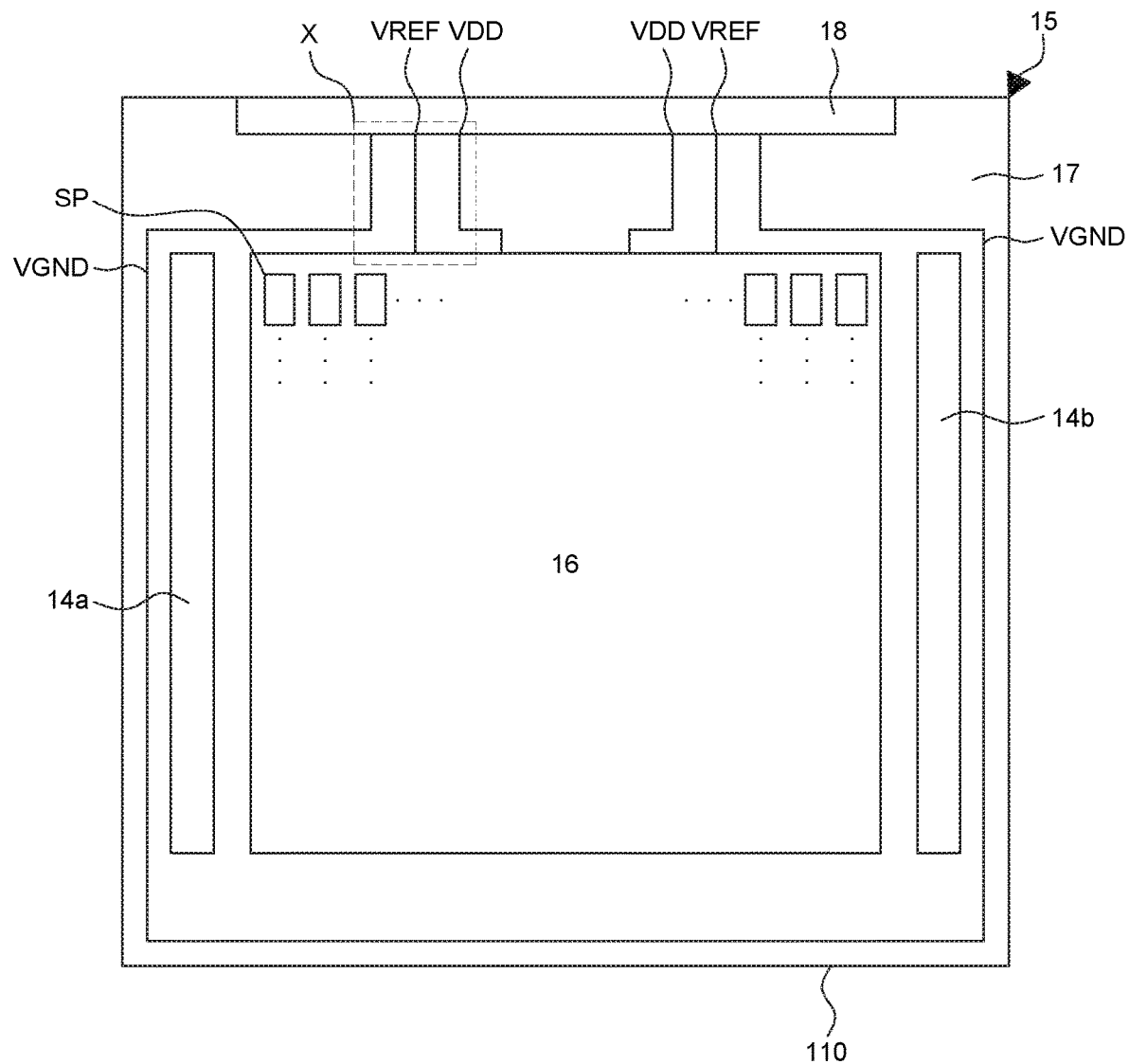
FIG. 4 is a plan view of an electroluminescence display device according to an exemplary embodiment of the present disclosure.

FIG. 4 is a plan view of an electroluminescence display device according to an exemplary embodiment of the present disclosure.

As illustrated in FIG. 4, the display panel 15 of the electroluminescence display device 100 according to an exemplary embodiment of the present disclosure includes a display area 16 and a non-display area 17 around the display area.

More specifically, a first substrate 110 of the display panel 15 includes the display area 16 in which a plurality of sub-pixels SP are formed and the non-display area 17 in which a first gate driver 14a, a second gate driver 14b, the high-voltage power supply line VDD, the low-voltage power supply line VGND, the reference line VREF, and a pad part 18 are formed.

The pad part 18 is formed in the non-display area 17 at an upper periphery of the first substrate 110. The pad part 18 is a pad area electrically connected to an external circuit board. For example, the pad part 18 is connected to a data circuit board on which a data driver is mounted or a control circuit board on which a timing controller is mounted.

The first gate driver 14a and the second gate driver 14b are formed in the form of GIP (Gate In Panel) on the display panel 15 and configured as circuits that output gate signals to the sub-pixels SP formed in the display area 16. The first gate driver 14a is formed in the non-display area 17 on the left of display area 16 and configured to supply a gate signal to the display area 16. The second gate driver 14b is formed in the non-display area 17 on the right of display area 16 and configured to supply a gate signal to the display area 16.

In the electroluminescence display device 100 according to an exemplary embodiment of the present disclosure, power supply lines include the high-voltage power supply line VDD, the low-voltage power supply line VGND, and the reference line VREF. Further, the power supply lines are disposed in the non-display area 17 between the pad part 18 at the upper periphery of the first substrate 110 and the display area 16.

More specifically, the high-voltage power supply line VDD is configured to transfer high-voltage power supplied from the outside such as a power supply unit to the sub-pixels SP formed in the display area 16 through the pad part 18.

Further, the low-voltage power supply line VGND is configured to transfer low voltage power (or ground power) supplied from the outside such as the power supply unit to the sub-pixels SP formed in the display area 16 through the pad part 18.

Furthermore, the reference line VREF is configured to transfer an initialization voltage (or sensing voltage) supplied from the outside such as the power supply unit to the sub-pixels SP formed in the display area 16 through the pad part 18 or transfer a sensing result to the data driver.

The power supply lines according to an exemplary embodiment of the present disclosure, i.e., the high-voltage power supply line VDD, the low-voltage power supply line VGND, and the reference line VREF, are not necessarily limited to the layout as illustrated in FIG. 4. The power supply lines may be disposed variously in position and number.

For example, the power supply lines may include at least one of the high-voltage power supply line VDD, the low-voltage power supply line VGND, and the reference line VREF. However, it is to be noted that the power supply lines may also include other signal lines, except for the above-mentioned lines VDD, VGND and VREF.

Figure 5:
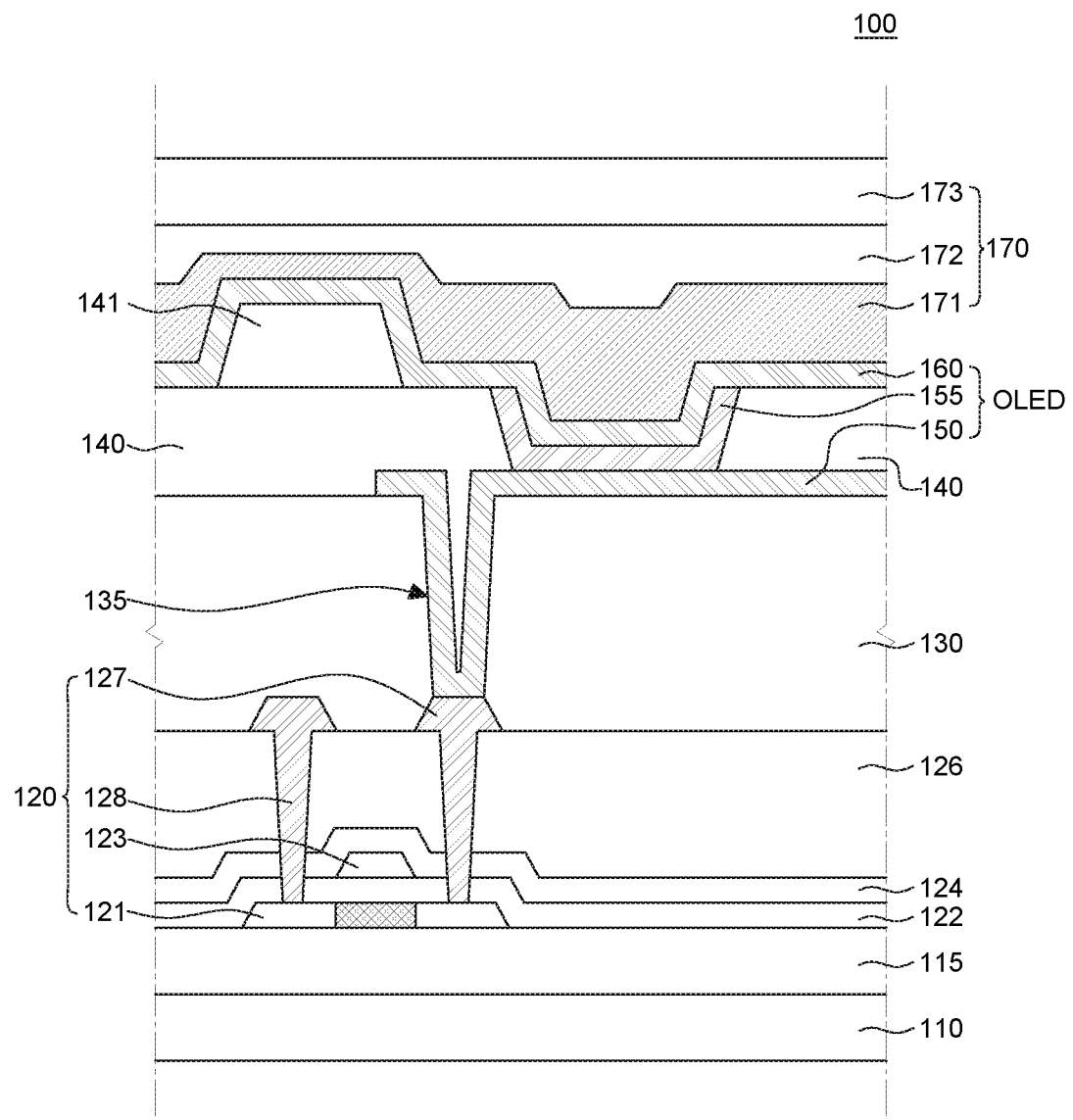
FIG. 5 is a cross-sectional view of electroluminescence display device according to an exemplary embodiment of the present disclosure.

FIG. 5 is a cross-sectional view of an electroluminescence display device according to an exemplary embodiment of the present disclosure.

That is, FIG. 5 is a diagram illustrating a detailed cross-sectional structure of a thin film transistor and the light emitting diode LED formed in the display area of the electroluminescence display device 100 according to an exemplary embodiment of the present disclosure.

Referring to FIG. 5, electroluminescence display device 100 according to an exemplary embodiment of the present disclosure includes a substrate 110, a thin film transistor 120 and a first electrode 150 positioned on the substrate 110, a second electrode 160, and the light emitting diode LED positioned between the first electrode 150 and the second electrode 160 and having an emission unit 155 including a plurality of layers and light emitting layers EML.

The electroluminescence display device 100 includes a plurality of sub-pixels. A sub-pixel refers to an area of a minimum unit for actually emitting a light. Further, a plurality of sub-pixels may form a minimum group that can express a white light. For example, three sub-pixels such as a red sub-pixel, a green sub-pixel, and a blue sub-pixel may form the minimum group. However, the present disclosure is not limited thereto. It is possible to design sub-pixels in various ways. FIG. 5 illustrates only one sub-pixel from among the plurality of sub-pixels of the electroluminescence display device 100 for convenience in explanation.

The substrate 110 is configured to support various components of the electroluminescence display device 100 and formed of an insulating material. The substrate 110 may be formed of glass or a flexible substrate having flexibility. For example, the substrate 110 may be formed of plastic such as polyethylene terephthalate (PET), polyethylene naphthalate (PEN), polyimide, etc.

A buffer layer 115 configured to block penetration of impurities from the substrate 110 or the outside and to protect various components of the electroluminescence display device 100 may be formed on the substrate 110. The buffer layer 115 may have a single layer or multiple layer structure including, e.g., a silicon oxide film (SiOx), or a silicon nitride film (SiNx). The buffer layer 115 may be omitted depending on a structure or characteristics of the electroluminescence display device 100.

The thin film transistor 120 including a semiconductor layer 121, a gate electrode 123, a source electrode 127, and a drain electrode 128 is formed on the buffer layer 115.

Specifically, the semiconductor layer 121 is formed on the substrate 110. A gate insulating layer 122 configured to insulate the semiconductor layer 121 from the gate electrode 123 is formed on the semiconductor layer 121.

An first interlayer 124 configured to insulate the gate electrode 123 from the source electrode 127 and the drain electrode 128 is formed on the gate electrode 123.

The source electrode 127 and the drain electrode 128 each of which is in contact with the semiconductor layer 121 are formed on the first interlayer 124. The source electrode 127 and the drain electrode 128 are electrically connected to the semiconductor layer 121 through a contact hole.

The semiconductor layer 121 may be formed of amorphous silicon (a-Si), polycrystalline silicon (poly-Si), oxide semiconductor, or organic semiconductor. If the semiconductor layer 121 is formed of oxide semiconductor, it may be formed of any one of indium gallium zinc oxide (IGZO), zinc tin oxide (ZTO), indium zinc oxide (IZO), or indium gallium oxide (IGO), indium tin zinc oxide (ITZO), but is not limited thereto.

The gate insulating layer 122 may have a single layer or multiple layer structure formed of an inorganic insulating material such as a silicon oxide film (SiOx), a silicon nitride film (SiNx), etc.

The gate electrode 123 functions to transfer a gate signal to the thin film transistor 120, and may be formed of at least one of metals such as aluminum (Al), molybdenum (Mo), titanium (Ti), and copper (Cu) or alloys thereof. The gate electrode 123 may have a single layer or multiple layer structure formed of the metals or alloys thereof.

Referring to FIG. 5, electroluminescence display device 100 according to an exemplary embodiment of the present disclosure may further include a second interlayer 126 on the first interlayer 124.

The source electrode 127 and the drain electrode 128 function to transfer an electrical signal transferred from the outside to the emission unit 155 via the thin film transistor 120. The source electrode 127 and the drain electrode 128 may be formed of at least one of metals such as aluminum (Al), molybdenum (Mo), titanium (Ti), and copper (Cu) or alloys thereof. The source electrode 127 and the drain electrode 128 may have a single layer or multiple layer structure formed of the metals or alloys thereof.

In the present disclosure, the thin film transistor 120 has been illustrated as a driving transistor for convenience in explanation. Each sub-pixel may further include a switching transistor or a capacitor.

A planarization layer 130 is formed on the thin film transistor 120. The planarization layer 130 functions to flatten an upper part of the thin film transistor 120. The planarization layer 130 may be configured as a single layer or a plurality of layers, and may be formed of an organic material. For example, the planarization layer 130 may be formed of any one of polyimide or photo acryl. The planarization layer 130 includes an anode contact hole 135 for electrically connecting the thin film transistor 120 and the first electrode 150 in each sub-pixel.

The first electrode 150 is formed on the planarization layer 130. The first electrode 150 may be an anode and may be formed of a conductive material having a relatively high work function value. Thus, the first electrode 150 functions to supply holes to the light emitting layer EML of the emission unit 155. The first electrode 150 is electrically connected to the thin film transistor 120 through the anode contact hole 135 formed in the planarization layer 130. For example, the first electrode 150 may be electrically connected to the source electrode 127 of the thin film transistor 120. Further, the first electrode 150 is disposed to be spaced from each other between sub-pixels. The first electrode 150 is formed of a transparent conductive material, and may be formed of, e.g., indium tin oxide (ITO), indium zinc oxide (IZO), etc.

If the electroluminescence display device 100 according to an exemplary embodiment of the present disclosure is of a top-emission type, a light emitted from the light emitting layer EML of the emission unit 155 is reflected by the first electrode 150. In this case, a reflective layer formed of a metal material, e.g., aluminum (Al) or silver (Ag), having a high reflection efficiency may be further formed on an upper or lower part of the first electrode 150 in order for the light to be more readily released in an upward direction.

For example, the first electrode 150 may have a two-layer structure in which a transparent conductive layer formed of a transparent conductive material and a reflective layer is laminated in sequence. Otherwise, the first electrode 150 may have a three-layer structure in which a transparent conductive layer, a reflective layer, and a transparent conductive layer are laminated in sequence. The reflective layer may be formed of silver (Ag) or an alloy including silver. For example, the reflective layer may be formed of silver (Ag) or APC (Ag/Pd/Cu).

In the exemplary embodiments of the present disclosure, the top-emission type refers to a structure in which a light emitted from the light emitting layer EML of the emission unit 155 is output in a direction toward the second electrode 160. A bottom-emission type refers to a structure in which the light is output in a direction toward the first electrode 150 on the contrary to the top-emission type.

The electroluminescence display device 100 according to the present exemplary embodiment is a top-emission electroluminescence display device in which a light emitted from the light emitting layer EML of the emission unit 155 is output in a direction toward the second electrode 160.

A bank layer 140 is formed on the first electrode 150. The bank layer 140 separates the adjacent sub-pixels and is disposed on one side of the first electrode 150 to expose a part of the first electrode 150. Further, the bank layer 140 may separate a plurality of sub-pixels.

The bank layer 140 may be formed of an organic material. For example, the bank layer 140 may be formed of polyimide, acryl, or benzocyclobutene (BCB)-based resin, but is not limited thereto.

In order to reduce reflection of an external light by the electroluminescence display device 100, the bank layer 140 may be formed of a material that decreases reflection of an external light. For example, the bank layer 140 of the electroluminescence display device 100 according to an exemplary embodiment of the present disclosure may include a black pigment. That is, photo resist for forming the bank layer 140 may be formed of a material including the black pigment. The black pigment may be formed of an organic material or an inorganic material.

The black pigment may be formed of a carbon-based material or metal oxide. Further, the photo resist may include photosensitive compounds including at least one of a polymer, a monomer, and a photoinitiator. Furthermore, the photoresist may include a solvent that disperses the photosensitive compounds.

A spacer 141 is formed on the bank layer 140. The spacer 141 may function to suppress the occurrence of defects caused by a mask during a process of depositing the plurality of organic layers or light emitting layers EML in the emission unit 155 or a process of forming the second electrode 160. The spacer 141 may be omitted depending on a method of manufacturing the electroluminescence display device.

The second electrode 160 is formed on the emission unit 155 and the first electrode 150. The second electrode 160 may be a cathode and needs to supply electrons to the light emitting layer EML of the emission unit 155. Thus, the second electrode 160 is formed of a conductive material having a low work function. More specifically, the second electrode 160 may be formed of a metal material such as magnesium (Mg), silver-magnesium (Ag:Mg), etc.

If the electroluminescence display device 100 according to an exemplary embodiment of the present disclosure is of the top-emission type, the second electrode 160 may be formed of transparent conductive oxide such as indium tin oxide (ITO), indium zinc oxide (IZO), indium tin zinc oxide (ITZO), zinc oxide (ZnO), and tin oxide (TiO).

The emission unit 155 is formed between the first electrode 140 and the second electrode 160. The emission unit 155 may include various layers as necessary and requisitely includes the light emitting layer EML. The layers may include at least one hole transport layer HTL and one electron transport layer ETL. The layers may further include functional layers including a hole injection layer, an electron injection layer, a hole blocking layer, an electron blocking layer, etc.

The light emitting layer EML included in the emission unit 155 may include a red light emitting layer configured corresponding to a red sub-pixel, a green light emitting layer configured corresponding to a green sub-pixel, and a blue light emitting layer configured corresponding to a blue sub-pixel.

A protective layer 170 is formed on the second electrode 160. The protective layer 170 may have a structure including a single layer formed as an inorganic film or an organic film or including a plurality of layers in which inorganic films and organic films are laminated. For example, the protective layer 170 may include a plurality of layers in which a first protective layer 171 formed as an inorganic film, a second protective layer 172 formed as an organic film, and a third protective layer 173 formed as an inorganic film are laminated, but is not necessarily limited thereto. Further, the protective layer 170 may further include functional layers such as a moisture absorption layer that can adsorb oxygen or moisture from the outside or a buffer layer that can delay permeation of oxygen or moisture.

Figure 6:
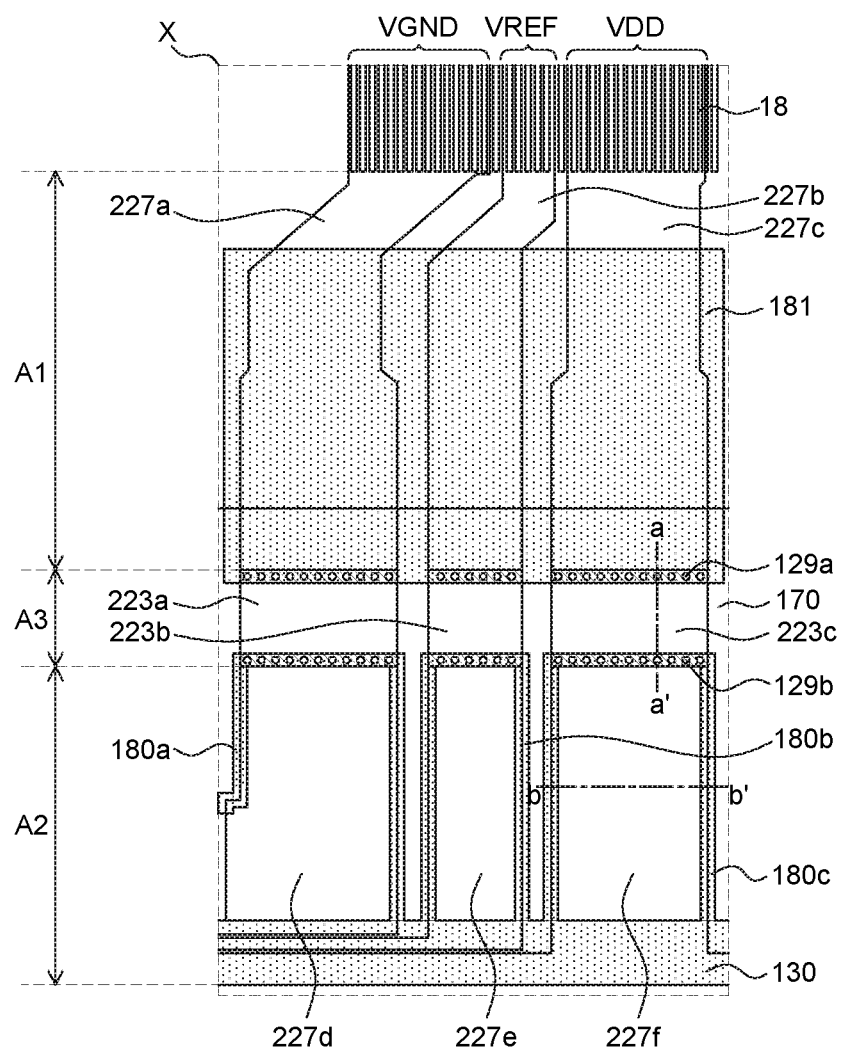
FIG. 6 is a plan view of electroluminescence display device according to an exemplary embodiment of the present disclosure.

FIG. 6 is a plan view of an electroluminescence display device according to an exemplary embodiment of the present disclosure.

That is, FIG. 6 is a diagram provided to explain a detailed plan structure of a power supply line area in a portion X of the non-display area 17 illustrated in FIG. 4.

Referring to FIG. 6, the power supply lines of the electroluminescence display device 100 according to an exemplary embodiment of the present disclosure include the high-voltage power supply line VDD, the low-voltage power supply line VGND, and the reference line VREF. The power supply lines are connected to the pad part 18 at the upper periphery of the first substrate 110 and function to transfer a signal or power from the outside to the thin film transistor within the display area 16.

More specifically, the high-voltage power supply line VDD is configured to transfer high-voltage power supplied from the outside such as a power supply unit to the sub-pixels SP formed in the display area 16 through the pad part 18.

The low-voltage power supply line VGND is configured to transfer low voltage power (or ground power) supplied from the outside such as the power supply unit to the sub-pixels SP formed in the display area 16 through the pad part 18.

The reference line VREF is configured to transfer an initialization voltage (or sensing voltage) supplied from the outside such as the power supply unit to the sub-pixels SP formed in the display area 16 through the pad part 18 or transfer a sensing result to the data driver.

In a relative electroluminescence display device, the power supply lines including the high-voltage power supply line VDD, the low-voltage power supply line VGND, and the reference line VREF are formed of the same material on the same layer as data lines, i.e., a source electrode and a drain electrode. The high-voltage power supply line VDD, the low-voltage power supply line VGND, and the reference line VREF are protected by the protective layer which is formed on the power supply lines in a subsequent process.

The high-voltage power supply line VDD, the low-voltage power supply line VGND, and the reference line VREF have sharply slanted edges of the lines due to the structural characteristics. In the power supply lines and the reference line, the edges are sharply slanted. Thus, parts of the edges of the lines may have damage or cracks caused by a developing solution used for a patterning process or an etching solution used for an etching process.

Therefore, in the relative electroluminescence display device, if moisture permeates from the outside through the pad part 18, moisture or oxygen may spread from the outside to the inside through the damage or cracks in the edges of the high-voltage power supply line VDD, the low-voltage power supply line VGND, and the reference line VREF along the edges of the high-voltage power supply line VDD, the low-voltage power supply line VGND, and the reference line VREF.

Further, the protective layer formed on the high-voltage power supply line VDD, the low-voltage power supply line VGND, and the reference line VREF may not completely cover the edges of the high-voltage power supply line VDD, the low-voltage power supply line VGND, and the reference line VREF. Thus, voids formed along the edges may form a moisture permeation path. Therefore, moisture or oxygen may spread from the outside to the inside along the edges of the power supply lines.

Referring to FIG. 6, each of the power supply lines, i.e., the high-voltage power supply line VDD, the low-voltage power supply line VGND, and the reference line VREF, of the electroluminescence display device 100 according to an exemplary embodiment of the present disclosure includes an area A1, an area A2, and an area A3 positioned between the area A1 and the area A2. And the area A3 is connected to the area A1 and the area A2. The area A1 and the area A2 are separate from each other. In this case, the area A1 of the power supply lines is adjacent to the pad part 18. The area A2 of the power supply lines is adjacent to the thin film transistor in the display area. Further, the protective layer 170 on the power supply lines is formed to cover at least a part of the first area A1 of the power supply lines and the protective layer 170 is formed to completely cover the second area A2 and the third area A3 of the power supply lines.

More specifically, referring to FIG. 6, the low-voltage power supply line VGND of the the protective layer 170 according to an exemplary embodiment of the present disclosure includes a first part 227a in the area A1, a second part 227d in the area A2, and a third part 223a in the area A3.

Further, the reference line VREF of the protective layer 170 according to an exemplary embodiment of the present disclosure includes a first part 227b in the area A1, a second part 227e in the area A2, and a third part 223b in the area A3.

Furthermore, the high-voltage power supply line VDD of the the protective layer 170 according to an exemplary embodiment of the present disclosure includes a first part 227c in the area A1, a second part 227f in the area A2, and a third part 223c in the area A3.

The third part 223a of the low-voltage power supply line VGND in the area A3 functions as a connection part that connects the first part 227a in the area A1 and the second part 227d in the area A2. The first part 227a and the second part 227d are separate from each other. The third part 223a may function to block a moisture permeation path which may be formed along the edge of the low-voltage power supply line VGND.

Further, the third part 223b of the reference line VREF in the area A3 functions as a connection part that connects the first part 227b in the area A1 and the second part 227e in the area A2. The first part 227b and the second part 227e are separate from each other. The third part 223b may function to block a moisture permeation path which may be formed along the edge of the reference line VREF.

Furthermore, the third part 223*c* of the high-voltage power supply line VDD in the area A3 functions as a connection part that connects the first part 227*c* in the area A1 and the second part 227*f* in the area A2. The first part 227*c* and the second part 227*f* are separate from each other. The third part 223*c* may function to block a moisture permeation path which may be formed along the edge of the high-voltage power supply line VDD.

Figure 7:
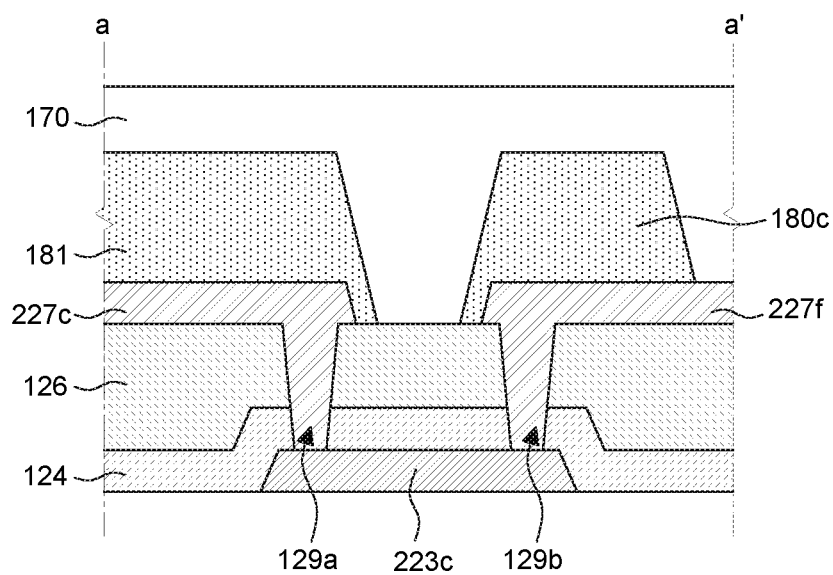
FIG. 7 is a cross-sectional view of electroluminescence display device taken along a line a-a' in FIG. 6 according to an exemplary embodiment of the present disclosure.

FIG. 7 is a cross-sectional view of an electroluminescence display device taken along a line a-a' in FIG. 6 according to an exemplary embodiment of the present disclosure.

Referring to FIG. 7, the first part 227*c* of the high-voltage power supply line VDD in the area A1 and the second part 227*f* of the high-voltage power supply line VDD in the area A2 are formed on the same layer. The first part 227*c* and the second part 227*f* are separate from each other. The third part 223*c* of the high-voltage power supply line VDD in the area A3 may be formed on a different layer from the first part 227*c* and the second part 227*f*. Further, referring to FIG. 7, the third part 223*c* having a connection part connecting the first part 227*c* and the second part 227*f* may be connected to each of the first part 227*c* and the second part 227*f* through one or more contact holes formed in an interlayer.

For example, the third part 223*c* of the high-voltage power supply line VDD is formed on a different layer from the first part 227*c* and the second part 227*f*. And the third part 223*c* of the high-voltage power supply line VDD functions as a connection part connecting the first part 227*c* and the second part 227*f* through at least one contact hole. Thus, the third part 223*c* may block a moisture permeation path which may be formed along the edge of the high-voltage power supply line VDD and reduce permeation of moisture from the outside.

More specifically, the first part 227*c* of the high-voltage power supply line VDD in the area A1 and the second part 227*f* of the high-voltage power supply line VDD in the area A2 may be formed of the same material as the source electrode 127 and the drain electrode 128 of the thin film transistor formed in the display area as shown in FIG. 5. The first part 227*c* and the second part 227*f* of the high-voltage power supply line VDD may be formed on the second interlayer 126, and the first part 227*c* and the second part 227*f* of the high-voltage power supply line VDD may be formed by the same process as the source electrode 127 and the drain electrode 128 of the thin film transistor formed in the display area. The first part 227*c* and the second part 227*f* are separate from each other.

Further, the third part 223*c* of the high-voltage power supply line VDD corresponding to a portion between the area A1 and the area A2 may be formed of the same material as the gate electrode 123 of the thin film transistor formed in the display area as shown in FIG. 5. The third part 223*c* of the high-voltage power supply line VDD may be formed by the same process as the gate electrode 123 of the thin film transistor formed in the display area.

Furthermore, the first part 227*c* may be connected to the third part 223*c* through a first contact hole 129*a* formed in the first interlayer 124 and the second interlayer 126. The second part 227*f* may be connected to the third part 223*c* through a second contact hole 129*b* formed in the first interlayer 124 and the second interlayer 126.

Referring to FIG. 6, the electroluminescence display device 100 according to an exemplary embodiment of the present disclosure includes anti-moisture permeation patterns 180*a*, 180*b*, and 180*c* which are layers formed along the edges of the power supply lines in the area A2 of the power supply lines, i.e., the high-voltage power supply line VDD, the low-voltage power supply line VGND, and the reference line VREF, and covering the edges of the power supply lines, respectively. The anti-moisture permeation patterns 180*a*, 180*b*, and 180*c* are formed under the protective layer 170 formed to cover the high-voltage power supply line VDD, the low-voltage power supply line VGND, and the reference line VREF.

More specifically, the electroluminescence display device 100 according to an exemplary embodiment of the present disclosure includes the anti-moisture permeation pattern 180*a* of the low-voltage power supply line VGND. The anti-moisture permeation pattern 180*a* of the low-voltage power supply line VGND is formed along an edge portion of the second part 227*d* of the low-voltage power supply line VGND and covering the edge portion of the second part 227*d* of the low-voltage power supply line VGND. Further, the electroluminescence display device 100 includes the anti-moisture permeation pattern 180*b* of the reference line VREF. The anti-moisture permeation pattern 180*b* of the reference line VREF is formed along an edge portion of the second part 227*e* of the reference line VREF and covering the edge portion of the second part 227*e* of the reference line VREF. Furthermore, the electroluminescence display device 100 includes the anti-moisture permeation pattern 180*c* of the high-voltage power supply line VDD. The anti-moisture permeation pattern 180*c* of the high-voltage power supply line VDD is formed along an edge portion of the second part 227*f* of the high-voltage power supply line VDD and covering the edge portion of the second part 227*f* of the high-voltage power supply line VDD.

Figure 8:
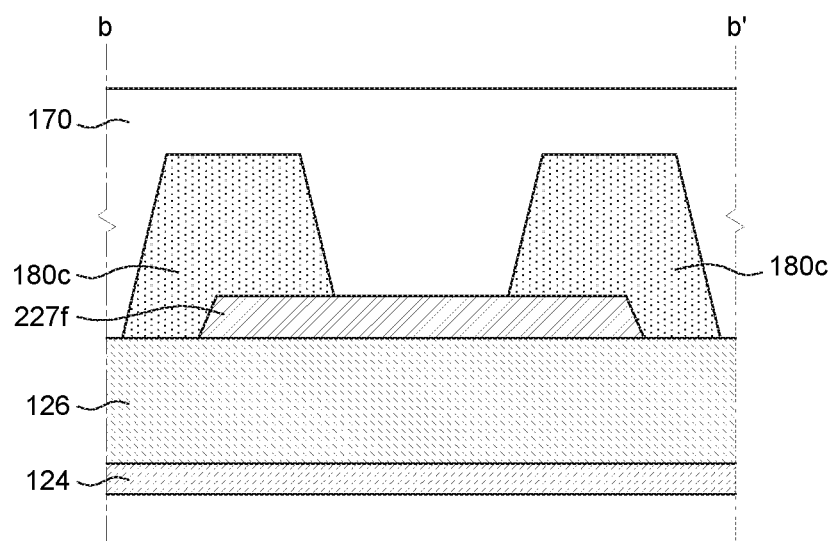
FIG. 8 is a cross-sectional view of electroluminescence display device taken along a line b-b' in FIG. 6 according to an exemplary embodiment of the present disclosure.

FIG. 8 is a cross-sectional view of an electroluminescence display device taken along a line b-b' in FIG. 6 according to an exemplary embodiment of the present disclosure.

Referring to FIG. 8, the second part 227*f* of the high-voltage power supply line VDD in the area A2 may be formed of the same material as the source electrode 127 and the drain electrode 128 of the thin film transistor formed in the display area. The second part 227*f* of the high-voltage power supply line VDD may be formed on the second interlayer 126. The second part 227*f* of the high-voltage power supply line VDD may be formed by the same process as the source electrode 127 and the drain electrode 128 of the thin film transistor formed in the display area. The anti-moisture permeation pattern 180*c* of the high-voltage power supply line VDD is formed to cover the left and right edges portion of the second part 227*f*.

For example, the anti-moisture permeation pattern 180*c* is formed to completely cover the left and right edges portion of the second part 227*f* of the high-voltage power supply line VDD. Thus, it is possible to reduce voids which may serve as a moisture permeation path along the edge portion of the high-voltage power supply line VDD. The voids may be generated when the protective layer 170 formed on the high-voltage power supply line VDD cannot completely cover the edge portion of the high-voltage power supply line VDD.

Further, in the electroluminescence display device 100 according to an exemplary embodiment of the present disclosure, the anti-moisture permeation pattern 180*a* of the low-voltage power supply line VGND, the anti-moisture permeation pattern 180*b* of the reference line VREF, and the anti-moisture permeation pattern 180*c* of the high-voltage power supply line VDD may be patterned and formed of the same material as the planarization layer 130 formed on the thin film transistor in the display area. The anti-moisture permeation pattern 180*a* of the low-voltage power supply line VGND may be formed on the edge portion of the second part 227d of the low-voltage power supply line VGND and the second interlayer 126. The anti-moisture permeation pattern 180b of the reference line VREF may be formed on the edge portion of the second part 227e of the reference line VREF and the second interlayer 126. The anti-moisture permeation pattern 180c of the high-voltage power supply line VDD may be formed on the edge portion of the second part 227f of the high-voltage power supply line VDD and the second interlayer 126. The anti-moisture permeation patterns (180a, 180b, 180c) may be formed by the same process as the planarization layer 130.

Also, referring to FIG. 6 and FIG. 7, the electroluminescence display device 100 according to an exemplary embodiment of the present disclosure may further include an additional anti-moisture permeation pattern 181. The additional anti-moisture permeation pattern 181 is formed to cover at least a part of the high-voltage power supply line VDD, the low-voltage power supply line VGND, and the reference line VREF in the area A1 of the power supply lines. Further, the additional anti-moisture permeation pattern 181 is formed to be overlapped with at least a part of the protective layer 170.

More specifically, the additional anti-moisture permeation pattern 181 is formed to cover parts of the power supply lines on the first part 227a of the low-voltage power supply line VGND, the first part 227b of the reference line VREF, and the first part 227c of the high-voltage power supply line VDD in the area A1. Also, the additional anti-moisture permeation pattern 181 is formed to be overlapped with at least a part of the protective layer 170. Thus, it is possible to suppress moisture or oxygen permeation through the edges portion of the low-voltage power supply line VGND, the reference line VREF, and the high-voltage power supply line VDD and also possible to protect the low-voltage power supply line VGND, the reference line VREF, and the high-voltage power supply line VDD against the external environment.

The additional anti-moisture permeation pattern 181 may be patterned and formed of the same material as the planarization layer 130 formed on the thin film transistor in the display area and may be formed on the first part 227a of VGND, the first part 227b of VREF, the first part 227c of VDD, and the second interlayer 126. The additional anti-moisture permeation pattern 181 may be formed by the same process as the planarization layer 130.

For example, in the electroluminescence display device 100 according to an exemplary embodiment of the present disclosure, the power supply lines VGND, VREF, and VDD include at least one connection part 223a, 223b, 223c formed on a different layer from the power supply lines under the protective layer 170. Also, the edge portion of the power supply lines VGND, VREF, and VDD corresponding to the second part (227d, 227e, 227f) are covered by the anti-moisture permeation patterns 180a, 180b, and 180c. Thus, it is possible to block a moisture permeation path which may be generated by voids, formed along the edges of the power supply lines under the protective layer, or damage or cracks at the edges of the power supply lines. And it is possible to suppress the moisture or oxygen permeation through the edges of the power supply lines of the electroluminescence display device.

Further, in the electroluminescence display device 100 according to an exemplary embodiment of the present disclosure, the occurrence of moisture or oxygen permeation through the edges of the power supply lines can be reduced, and, thus, it is possible to decrease image quality defects of the electroluminescence display device and also possible to improve the reliability of the electroluminescence display device.

Figure 9:
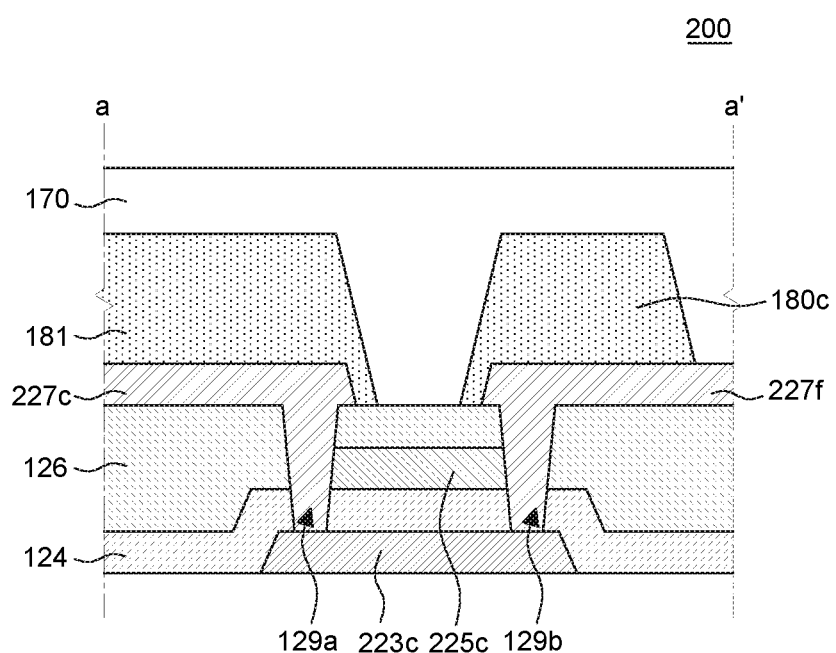
FIG. 9 is a cross-sectional view of electroluminescence display device taken along a line a-a' in FIG. 6 according to another exemplary embodiment of the present disclosure.

FIG. 9 is a cross-sectional view of an electroluminescence display device 200 taken along a line a-a' in FIG. 6 according to another exemplary embodiment of the present disclosure.

In explaining the electroluminescence display device 200 according to another exemplary embodiment of the present disclosure, detailed description of components identical or corresponding to those of the above-described exemplary embodiments will be omitted or briefly provided.

Referring to FIG. 9, the electroluminescence display device 200 according to another exemplary embodiment of the present disclosure may further include an additional connection part 255c that connects the first part 227c and the second part 227f. The additional connection part 255c is connecting the first part 227c of the high-voltage power supply line VDD in the area A1 and the second part 227f of the high-voltage power supply line VDD in the area A2.

The additional connection part 255c may be interposed between the first interlayer 124 and the second interlayer 126. Further, the additional connection part 255c may improve a contact characteristics between the first part 227c and the second part 227f of the high-voltage power supply line VDD and reduce a resistance of the high-voltage power supply line VDD.

For example, the third part 223c of the high-voltage power supply line VDD as a connection part is formed on a different layer from the first part 227c and the second part 227f and connects the first part 227c and the second part 227f through at least one contact hole. And the additional connection part 255c connects the first part 227c and the second part 227f. Thus, it is possible to block a moisture permeation path which may be formed along the edge of the high-voltage power supply line VDD and thus possible to reduce permeation of moisture from the outside.

The exemplary embodiments of the present disclosure can also be described as follows:

According to an aspect of the present disclosure, an electroluminescence display device includes a display area, a non-display area positioned adjacent to an outer periphery of the display area, a thin film transistor in the display area, and a power supply line in the non-display area and connected to the thin film transistor. The power supply line includes a first part and a second part separated from each other, and a third part connected to the first part and the second part, and also includes a first layer formed along an edge portion of the power supply line and covering the edge portion of the power supply line. For example, in the electroluminescence display device according to an aspect of the present disclosure, the power supply line includes at least one connection part formed on a different layer from the power supply line under the protective layer and the anti-moisture permeation pattern formed along the edge portion of the power supply line and covering the edge portion of the power supply line. Thus, it is possible to block a moisture permeation path generated by voids, formed along the edge portion of the power supply line under the protective layer, or damage or cracks at the edge portion of the power supply line. Therefore, it is possible to suppress the moisture or oxygen permeation into the electroluminescence display device through the edge portion of the power supply line. The electroluminescence display device according to an aspect of the present disclosure can reduce the occurrence of moisture or oxygen permeation through the edge portion of the power supply line. Thus, it is possible to reduce image quality defects of electroluminescence display device and also possible to improve the reliability of the electroluminescence display device.

The electroluminescence display device includes an planarization layer covering the thin film transistor, and the first layer may be formed of the same material as the planarization layer.

The thin film transistor may include a semiconductor layer, a gate insulating layer, a gate electrode, an interlayer and source electrode and drain electrode laminated in sequence.

The first part and the second part may be formed of the same material as the source electrode and drain electrode.

The first part and the second part may be on the same layer, and the third part may include a connection part on a different layer from the first part and the second part.

The connection part of the third part may be connected to each of the first part and the second part through at least one or more contact hole in an interlayer.

The connection part of the third part may be formed of the same material as the gate electrode.

The third part may further include an additional connection part configured to connect the first part and the second part.

The first layer is positioned in the second part.

The power supply line may include at least one of a high-voltage power supply line VDD, a low-voltage power supply line VGND, and a reference power supply line VREF.

The electroluminescence display device according to an exemplary embodiment of the present disclosure may further include a second layer covering the first part.

The electroluminescence display device according to an exemplary embodiment of the present disclosure may include a planarization layer covering the thin film transistor. The second layer may be formed of the same material as the planarization layer.

According to another aspect of the present disclosure, an electroluminescence display device includes a substrate including a display area and a non-display area, a first electrode and a second electrode on the substrate, and an emission unit between the first electrode and the second electrode. The electroluminescence display device includes a power supply line positioned in the non-display area and connected to a thin film transistor positioned in the display area and a protective layer configured to cover at least a part of the power supply line. The power supply line includes a connection part under the protective layer and an anti-moisture permeation pattern formed along an edge of the power supply line and covering the edge of the power supply line. Thus, it is possible to suppress moisture or oxygen permeation through the edge of the power supply line. For example, in the electroluminescence display device according to another aspect of the present disclosure, the power supply line includes at least one connection part formed on a different layer from the power supply line under the protective layer and the anti-moisture permeation pattern formed along the edge of the power supply line and covering the edge of the power supply line. Thus, it is possible to block a moisture permeation path generated by voids, formed along the edge of the power supply line under the protective layer, or damage or cracks at the edge of the power supply line. Therefore, it is possible to reduce the occurrence of moisture or oxygen permeation into the electroluminescence display device through the edge of the power supply line.

The electroluminescence display device according to another aspect of the present disclosure can reduce the occurrence of moisture or oxygen permeation through the edge of the power supply line. Thus, it is possible to decrease image quality defects of the electroluminescence display device and also possible to improve the reliability of the electroluminescence display device.

The electroluminescence display device may further include a pad part in the non-display area. The power supply line may include a first part adjacent to the pad part and a second part adjacent to the thin film transistor in the display area. The connection part may be positioned in a third part between the first part and the second part and may connect the first part and the second part.

The connection part of the third part may be connected to each of the first part and the second part through at least one or more contact hole in an interlayer.

The first part and the second part may be formed of the same material as source electrode and drain electrode of the thin film transistor.

The connection part of the third part may be formed of the same material as a gate electrode of the thin film transistor.

The anti-moisture permeation pattern may be formed of the same material as a planarization layer covering the thin film transistor.

The anti-moisture permeation pattern may be positioned in the second part.

The electroluminescence display device according to another aspect of the present disclosure may include an additional anti-moisture permeation pattern overlapping with at least a part of the protective layer and covering the first part.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. An electroluminescence display device comprising:
a display area;
a non-display area positioned adjacent to an outer periphery of the display area;
a pad part in the non-display area;
a thin film transistor in the display area;

a power supply line in the non-display area and connected to the thin film transistor, the power supply line including:
   a first part connected to the pad part,
   a second part spaced apart from the first part along a first direction, and
   a third part extending along the first direction and connected between the first part and the second part, the third part having a width along a second direction that is substantially the same as a width along the second direction of at least one of the first part or the second part, the second direction being transverse to the first direction;
a first layer covering, and in direct contact with, first, second, and third edges of the second part of the power supply line, the first edge faces the first part of the power supply line along the first direction, and the second and third edges are opposite one another along the second direction, a central portion of a surface of the second part of the power supply line being uncovered by the first layer between the first, second, and third edges;
a second layer covering the first part of the power supply line, the second layer being in direct contact with, and covering, an edge of the first part of the power supply line that faces the first edge of the second part of the power supply line, the second layer spaced apart from the first layer along the first direction by a gap; and
a protective layer on the first layer and the second layer, at least a portion of the protective layer disposed in the gap and extending in the gap from the first layer to the second layer.

2. The electroluminescence display device according to claim 1, further comprising:
   a planarization layer covering the thin film transistor,
   wherein the first layer is formed of a same material as the planarization layer.

3. The electroluminescence display device according to claim 1, wherein the thin film transistor has a structure in which a semiconductor layer, a gate insulating layer, a gate electrode, an interlayer, a source electrode and a drain electrode are laminated in sequence.

4. The electroluminescence display device according to claim 3, wherein the first part and the second part of the power supply line are formed of the same material as the source electrode and the drain electrode.

5. The electroluminescence display device according to claim 3, wherein the first part and the second part are on a same layer, and
   the third part includes a connection part on a different layer from the first part and the second part.

6. The electroluminescence display device according to claim 5, wherein the connection part of the third part is connected to each of the first part and the second part through at least one contact hole in the interlayer.

7. The electroluminescence display device according to claim 5, wherein the connection part of the third part is formed of a same material as the gate electrode.

8. The electroluminescence display device according to claim 5, wherein
   the third part further includes an additional connection part that connects the first part to the second part, and
   the additional connection part is disposed on a different layer from the connection part.

9. The electroluminescence display device according to claim 1, wherein the power supply line includes at least one of a high-voltage power supply line VDD, a low-voltage power supply line VGND, and a reference power supply line VREF.

10. The electroluminescence display device according to claim 1, further comprising:
    a planarization layer covering the thin film transistor,
    wherein the second layer is formed of a same material as the planarization layer.

11. The electroluminescence display device according to claim 1, wherein the protective layer abuts respective portions of the first layer that cover the first, second, and third edges of the second portion of the power supply line.

12. An electroluminescence display device, comprising:
    a substrate including a display area and a non-display area;
    a pad part in the non-display area;
    a power supply line positioned in the non-display area and connected to a thin film transistor positioned in the display area, the power supply line including:
      a first part adjacent to the pad part,
      a second part adjacent to the thin film transistor in the display area, and
      a third part between the first part and the second part, the third part including a connection part which connects the first part and the second part;
    a protective layer configured to cover at least a part of the power supply line; and
    an anti-moisture permeation pattern formed along edge portions of the power supply line, the anti-moisture permeation pattern in direct contact with a surface of the second part of the power supply line and covering opposite first and second edge portions of the second part of the power supply line, the first and second edge portions being spaced laterally apart from one another along a width of the second part of the power supply line, a central portion of the surface of the second part of the power supply being uncovered by the anti-moisture permeation pattern along the width of the second part of the power supply from the first edge portion to the second edge portion,
    wherein the protective layer directly contacts the surface of the power supply line from a first portion of the anti-moisture permeation pattern that covers the first edge portion of the power supply line to a second portion of the anti-moisture permeation pattern that covers the second edge portion of the power supply line, the protective layer directly contacting and completely covering the central portion of the surface of the second part of the power supply line.

13. The electroluminescence display device according to claim 12, wherein the connection part of the third part is connected to each of the first part and the second part through at least one or more contact holes in an interlayer.

14. The electroluminescence display device according to claim 12, wherein the first part and the second part are formed of the same material as a source electrode or a drain electrode of the thin film transistor.

15. The electroluminescence display device according to claim 14, wherein the connection part of the third part is formed of the same material as a gate electrode of the thin film transistor.

16. The electroluminescence display device according to claim 12, wherein the anti-moisture permeation pattern is formed of a same material as a planarization layer covering the thin film transistor.

17. The electroluminescence display device according to claim 12, wherein the anti-moisture permeation pattern is in direct contact with and covering a third edge portion of the second part of the power supply line, the third edge portion facing the first part of the power supply line.

18. The electroluminescence display device according to claim 12, further comprising:

an additional anti-moisture permeation pattern underlying at least a part of the protective layer and covering the first part of the power supply line.

19. The electroluminescence display device according to claim 12, further comprising:

a first electrode and a second electrode on the substrate and an emission unit between the first electrode and the second electrode.

20. The electroluminescence display device according to claim 12, wherein the anti-moisture permeation pattern is formed under the protective layer.

21. The electroluminescence display device according to claim 12, wherein the third part further includes an additional connection part configured to connect the first part and the second part, and the additional connection part is spaced apart from the connection part by at least one insulating layer.

22. The electroluminescence display device according to claim 12, wherein the power supply line includes at least one of a high-voltage power supply line VDD, a low-voltage power supply line VGND, and a reference power supply line VREF.

23. The electroluminescence display device according to claim 17, further comprising an additional anti-moisture permeation pattern in direct contact with and covering an edge of the first part of the power supply line that faces the third edge portion of the second part of the power supply line, wherein the protective layer extends between and abuts facing surfaces of the anti-moisture permeation pattern and the additional anti-moisture permeation pattern.

\* \* \* \* \*